United States Patent [19]
Tremmel

[11] Patent Number: 5,409,239
[45] Date of Patent: Apr. 25, 1995

[54] TOUCH SENSITIVE VIDEO GAME CONTROLLER

[75] Inventor: Michael Tremmel, 1136 Luzerne St., Scranton, Pa. 18504

[73] Assignee: Michael Tremmel, Scranton, Pa.

[21] Appl. No.: 966,362

[22] Filed: Oct. 26, 1992

[51] Int. Cl.$^6$ ............................................. A63F 9/24
[52] U.S. Cl. ............................... 273/438; 273/148 B
[58] Field of Search ............... 273/148 R, 148 B, 434, 273/438, DIG. 28; 345/156, 157, 160; 341/20

[56] References Cited

U.S. PATENT DOCUMENTS

| | | | |
|---|---|---|---|
| 2,186,825 | 1/1940 | Dome | 200/DIG. 2 |
| 2,576,929 | 12/1951 | Ercolino | 200/159 A |
| 2,659,533 | 11/1953 | Quinby et al. | 317/123 P |
| 3,737,670 | 6/1973 | Larson | 307/116 |
| 3,973,255 | 8/1976 | Freeman | 345/173 |
| 4,071,691 | 1/1978 | Pepper, Jr. | 273/DIG. 28 |
| 4,302,011 | 11/1981 | Pepper, Jr. | 273/DIG. 28 |
| 4,306,232 | 12/1981 | Burson | 273/438 |
| 4,357,014 | 11/1982 | Baer et al. | 273/438 |
| 4,500,879 | 2/1985 | Smith, III et al. | 273/438 |
| 4,613,139 | 9/1986 | Robinson, II | 273/438 |
| 5,172,101 | 12/1992 | Bates | 273/148 B |
| 5,207,426 | 5/1993 | Inoue et al. | 273/148 B |

*Primary Examiner*—Jessica J. Harrison

[57] ABSTRACT

Disclosed is a hand held video game controller for use with a video game computer such as used in home and arcade video games. The controller uses a number of electrically conductive contact points adapted to touch the skin of the hands of the user whereby the electrical resistance of the skin of the hands and fingers of the user to the passage of electric current from one or more of the contact points will activate one or more switch circuits within the controller housing are connected to a video game computer. Also disclosed is an oscillator circuit within the controller that provides for special functions within the video game computer.

5 Claims, 8 Drawing Sheets

TOUCH SENSITIVE VIDEO GAME CONTROLLER

BACKGROUND OF THE INVENTION

1. Field of the Invention

This invention pertains to a controller for human interaction in video games with any video game machine system.

2. Description of the Prior Art

The controller for the Nintendo Entertainment System is described under U.S. Pat. No. 4,687,200. This controller is one example of the features present in most prior art video game controller inventions. The buttons that come in contact with the skin are hard plastic projections. These projections have rough hard edges that can cause injury to the skin due to collision during video game playing. The four directional control buttons consist of a cross shaped button projection which pivots on the center axis. The cross shaped button has harsh corners, edges and arrow symbols embedded in the plastic. A directional change during video game playing involves the thumb of the left hand. As the thumb moves from the left button it drags across with downward pressure to the right side button which pivots the cross shaped button and changes the direction. This technique is true for changing from any one direction to another. The downward pressure necessary to engage the directional buttons in conjunction with the dragging of the thumb causes blisters on the skin and physically stresses the tendons and muscles of the hand. Another disadvantage to the controller is that the buttons are not engaged until they are displaced a distance inward. The time to depress a button is minute; however, today's advanced video games require split second timing on the part of the video game player to engage a certain button at a certain time and if that is not accomplished it can result in the end of the game. The short time period of switch engagement although minute, if reduced, can result in the difference of winning instead of losing a video game.

The U.S. Pat. No. 5,207,426 is a controller for the Super Nintendo Entertainment System. This patented invention is a slight improvement on the old version of the Nintendo controller. The design of the controller reduces the harshness of the touchable surfaces by rounding edges and using softer materials for the button projections. This design only diminishes the blistering effect on the skin. The stress on the tendons and muscles of the hands has not been decreased by this design because the buttons still require pressure to be engaged. The buttons for the Super Nintendo controller must be depressed inward which reduces the player's reaction time. Occasionally with this type of controller design, the buttons are not depressed hard enough to engage the switches; as a result this can cause the end of the game and give frustration to the player.

The Human-Machine Interface Apparatus invention of U.S. Pat. No. 4,071,691 and the Video Game Apparatus and Method invention of U.S. Pat. No. 4,302,011 are slightly similar in the rough concept notion to the Touch Sensitive Video Game Controller invention, but differ in many respects such as objective, intent, design, limitations and appearance. The objective of these patented inventions are to eliminate projecting knobs and buttons by transferring them all to one uniformly smooth surface which prevents injury from collision with knobs or levers, enhancing the esthetic appeal, and protecting devices used by the public from vandalism. The intent of these inventions is to allow natural and convenient two-axis motions without the mental translation required to use two separate knobs or levers. The designs use various frequencies and/or phase differences which electronically is an analog form of processing information. One limitation of such information processing is the physical design must be precisely constructed with high quality control standards to strictly small tolerance discrepancies in fulfillment of a linear resistance across the x and y coordinates of the inventions. The circuits use analog frequencies which must be finely tuned to each other and the phase sensor surface causing another limitation; this must be done for each individual controller constructed. The analog output signals must be converted into a digital form that computer systems can recognize. Also consider this limitation, some information loss occurs during the process of an analog to digital conversion, and can not be converted at the same exact voltages for replicas of the controller; this is due to the variance within tolerances of electronic components. The appearance of the latter patent mentioned is a flat dull looking device; that must be looked upon in order to see what section of the controller the finger is touching. This is a great disadvantage in video game playing for when the eyes look away from the viewing screen an error in game execution may occur due to the fast-paced nature of current video game systems.

One objective of the game controller of this invention is to eliminate the pushing down of buttons by using touch sensitive circuitry. Another objective of this invention is to keep the electrical conductive contact points as smooth and/or soft as possible. The intent of this invention is to reduce stress on the tendons and muscles of the hands including skin blisters, increase reaction time of the engagement of the switches by the player, and have the touch sensitive buttons projecting out of the controller so that the player can distinguish between the various buttons with the sense of touch. The design of this invention is a digital form of processing information. This design is a combination of electronic circuits joined in this manner to create a new video game controller. The appearance of the invention has smooth buttons, and is small enough to fit comfortably within the palms of the two hands.

BRIEF SUMMARY OF THE INVENTION

The video game controller is an improved version of most prior art controllers. The main improvement that sets this invention apart from any other known controller is the touch sensitive circuitry that is added with prior art digital computer interface circuitry. The resulting combination is a new and more effective controller for video game playing. This invention includes touch sensitive circuitry and oscillator circuitry as variations on the embodiment. The invention is such that the computer interface circuitry, and number of conductor contact points can be changed to use the new invention with almost any commercial or home computer video game system.

The invention improves reaction time during video game playing. This reduction in reaction time adds excitement to the game for the player or players. It also reduces the stress on the hands and skin of the player. The electrically conductive material used for the contact points can be metal or a soft material.

DESCRIPTION OF THE PREFERRED EMBODIMENTS

Figure 1:
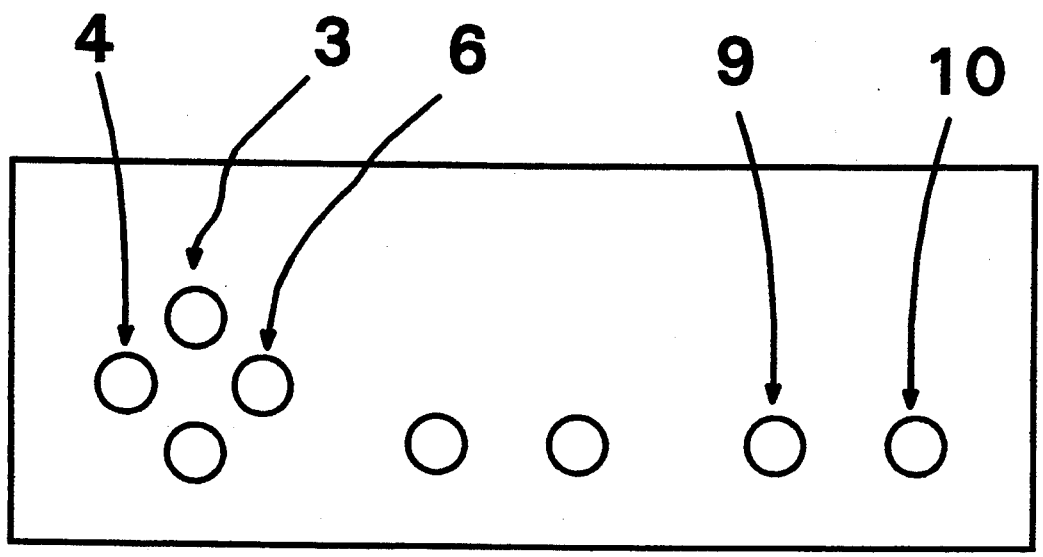
FIG. 1 is a top view in accordance with one embodiment of the invention, showing the conductor contact points and their relative positions.
Figure 2:
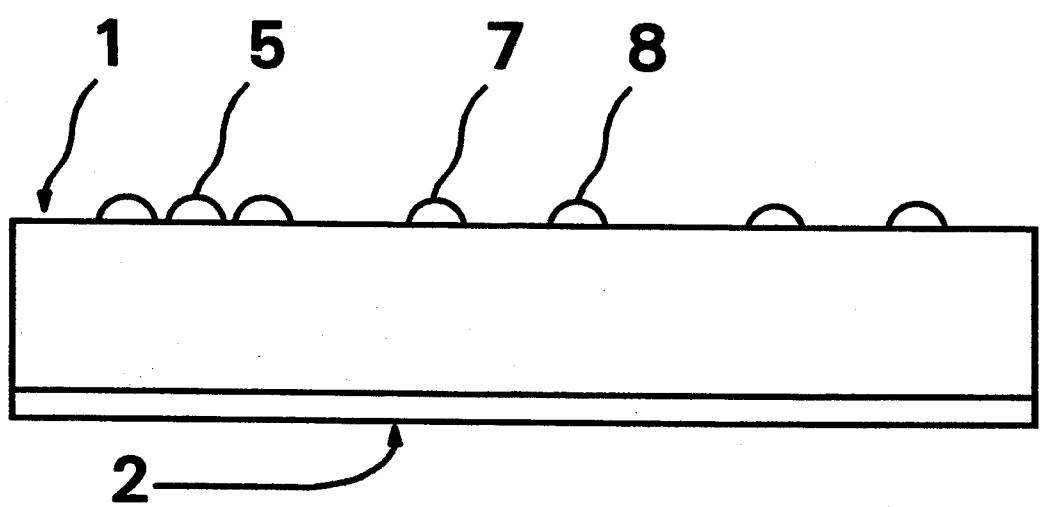
FIG. 2 is a front view of the embodiment of FIG. 1, showing the various parts and the smoothness of the contact points.

FIGS. 1 and 2 are views of the appearance of the touch sensitive controller in accordance with one embodiment of the invention. FIG. 1 is the top view of the touch sensitive controller. FIG. 2 is the front view of the touch sensitive controller.

Referring to FIGS. 1 and 2, the outside casing 1 is a durable non-conductive material that contains, insulates, and protects the inner circuits. The dimensions of the outside casing 1 are to be within reasonable size to accommodate all the needed contact points 3 through 10 and fit comfortably in the palms of both hands. The main contact point 2 must be in contact with the skin of the palms for any of the contact points 3 through 10 to complete the switching in the touch sensitive circuitry 12 in FIG. 3. When the skin and finger 11 in FIG. 3 bridges one or more of the contact points 3 through 10 to the main contact point 2 those touch sensitive switch circuits are engaged. The contact points 3 through 6 control the direction of a character on the video game screen. The character is any video displayed object on the game screen. Contact point 3 moves the character up on the screen, 4 moves the character to the left, 5 moves the character down, and contact point 6 moves the character to the right of the screen. Contact point 7 is a select switch which the player uses to select options on the video game screen and contact point 8 is the start button which initiates the video game from the beginning. Contact points 9 and 10 are action buttons which depend upon the certain video game cartridge installed in the computer system. The specific functions of the contact points 3 though 10 can vary depending on the video game or a level change in the game.

Figure 3:
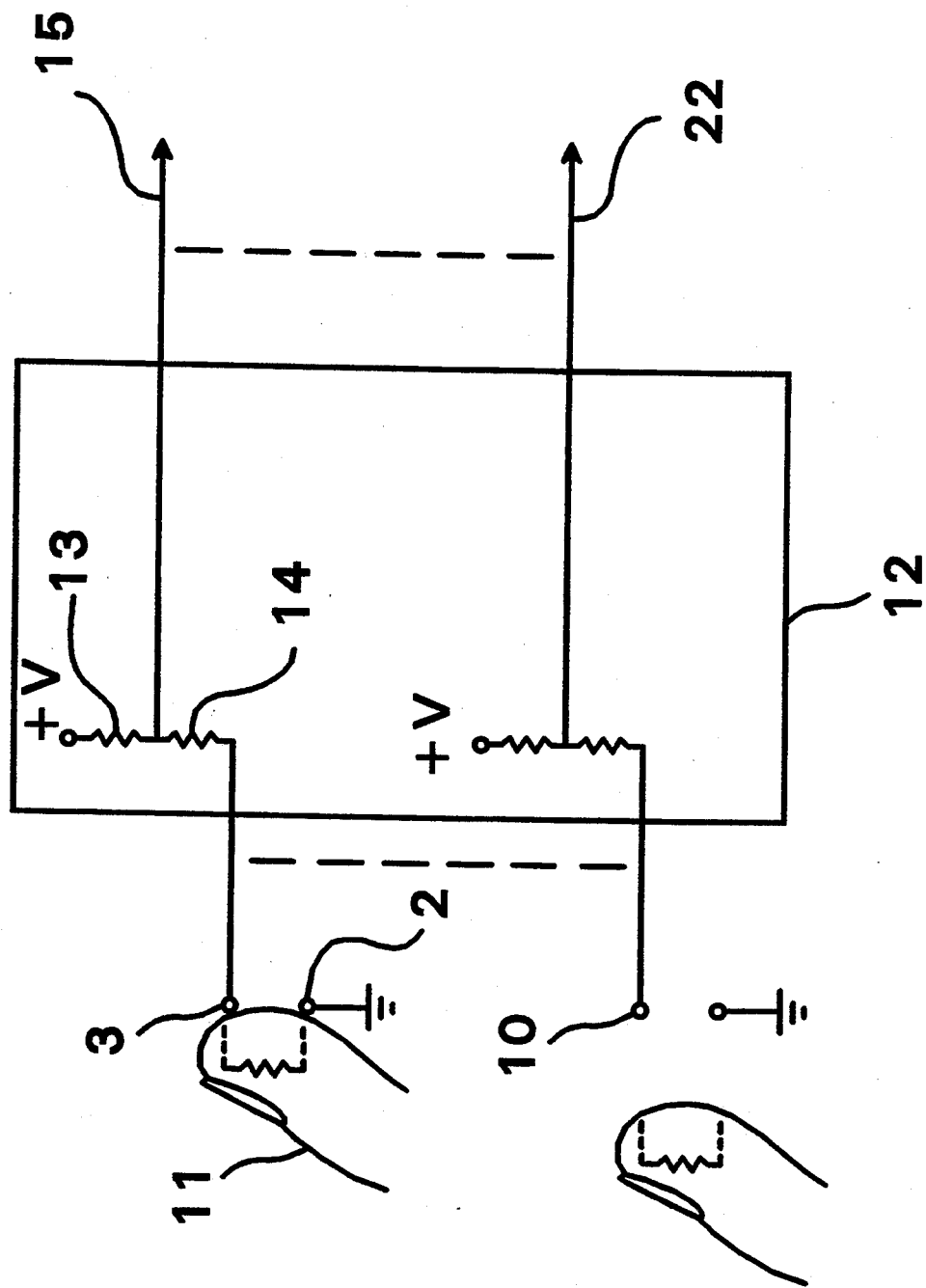
FIG. 3 is a block diagram of the touch sensitive circuitry.

FIG. 3 shows the basic design of the touch sensitive circuitry for the video game controller of this invention.

The contact points 3 through 10 are connected to the touch sensitive circuitry 12. These connections convert the contact points 3 through 10 into touch activated switches with corresponding outputs 15 to 22. In FIG. 3 the resistors 13 and 14 control the sensitivity of that touch sensitive switch. Generally, resistor 13 is a very high resistance and resistor 14 is roughly 200 times smaller in resistance. The actual resistance values of 13 and 14 can be changed to produce a desired sensitivity level. The computer interface circuitry 24 of FIG. 4 requires a digital input 0 (zero voltage=circuit ground) in order to activate the switches 15 to 22; consequently a digital input 1 (+V is usually +5 volts=circuit supply voltage) deactivates the switches 15 to 22. The touch sensitive input contact point 3 in FIG. 3 is in contact with point 2 through the electrical resistance of the skin 11; therefor, the output 15 of the touch sensitive circuitry is connected to circuit ground through 14 and 11 and must be close to zero volts to activate that switch on the computer interface circuitry 24. Current flows from the +5 volt voltage source +V though resistors 13, 14, and 11 which produces a voltage drop at output 15 of about +1 volt. This voltage output of +1 volt is close enough to 0 volts to activate the input 15 of the computer interface circuitry 24 in FIG. 4 which is the desired effect for the resulting input on contact point 3 in FIG. 3. The input contact point 10 in FIG. 3 is not in contact with point 2 through the electrical resistance of the skin 11; therefor, the output 22 of the touch sensitive circuitry must be +5 volts to deactivate that switch on the computer interface circuitry 24. There is no path to ground for the touch sensitive circuitry of contact point 10 except though 22 the high input resistance of the computer interface circuitry 24. The high resistance of the input 22 causes current flow to be very small which gives a voltage drop of +5 volts at the input 22 of the computer interface circuitry 24. This voltage input of +5 volts deactivates the input 22 of the computer interface circuitry 24 which is the desired effect for the resulting input on contact point 10 in FIG. 3.

Figure 4:
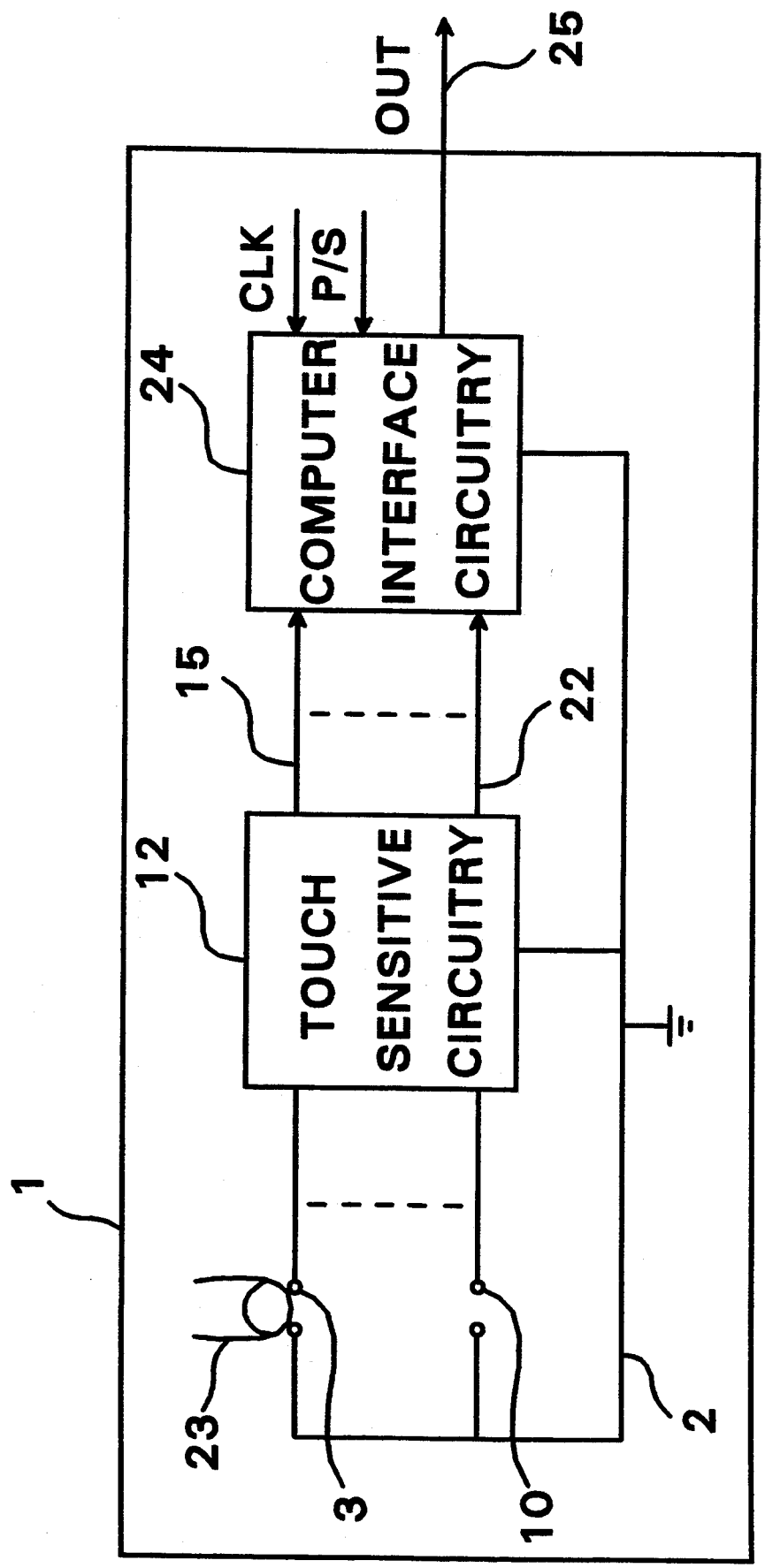
FIG. 4 is a block diagram of the embodiment of FIGS. 1 and 2 illustrating the electronic circuitry needed to use the invention with the Nintendo Entertainment System.

FIG. 4 is a block diagram which shows the connections for the electronic circuitry of FIGS. 1 and 2. The input contact points 3 to 10 are connected to the touch sensitive circuitry 12 which outputs the status of the inputs 3 to 10 on connections 15 to 22. The information about the status of the switches is transferred from touch sensitive circuitry 12 into the computer interface circuitry 24. The computer interface circuitry 24 converts the information to a form that the Nintendo Entertainment System can read, and outputs the information to the computer system through the output connection 25.

Figure 5:
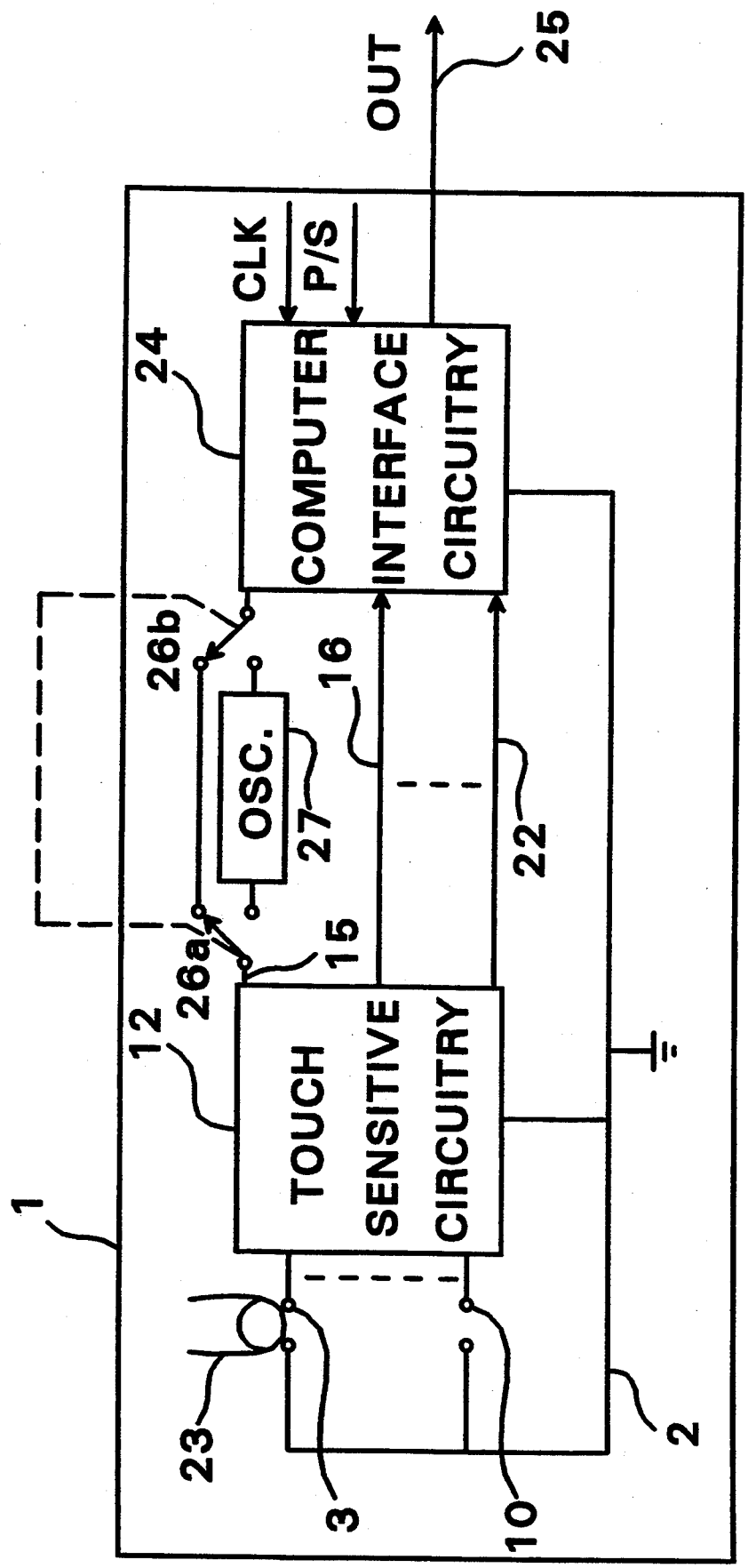
FIG. 5 is a block diagram of the added oscillator circuitry embodiment of the invention for use with the Nintendo Entertainment System.

FIG. 5 shows one embodiment of the invention with an oscillator 27 added between the touch sensitive circuitry 12 and the computer interface circuitry 24. The oscillator 27 is to provide a continuous digital pulse when a touch sensitive contact that the oscillator relates to is engaged. When the touch sensitive contact is disengaged the oscillator circuitry 27 is disabled. The switch 26 converts contact point 3, which relates with touch sensitive output 15 and oscillator 27, to either a normal operating touch sensitive switch or to a rapid turning "on" and "off" of the switch. This rapid oscillation switches the contact 3 point "on" and "off" faster than can be done with the finger 23. This is a great video game playing advantage; for example, firing projectiles at a fast rate towards any opposing video game character. Separate oscillator circuitry can be added to each touch sensitive switch, with similar connections as shown in FIG. 5, if so desired. The oscillator circuitry 27 alternates the output from +5 volts to 0 volts at a constant rate determined by the frequency. The frequency is the rate of speed the output is changed from a high logic level to a low level. The computer interface circuitry 24 converts the status of the inputted oscillator signal and outputs on the connection 25 the information in a format the Nintendo Entertainment System recognizes.

Figure 6:
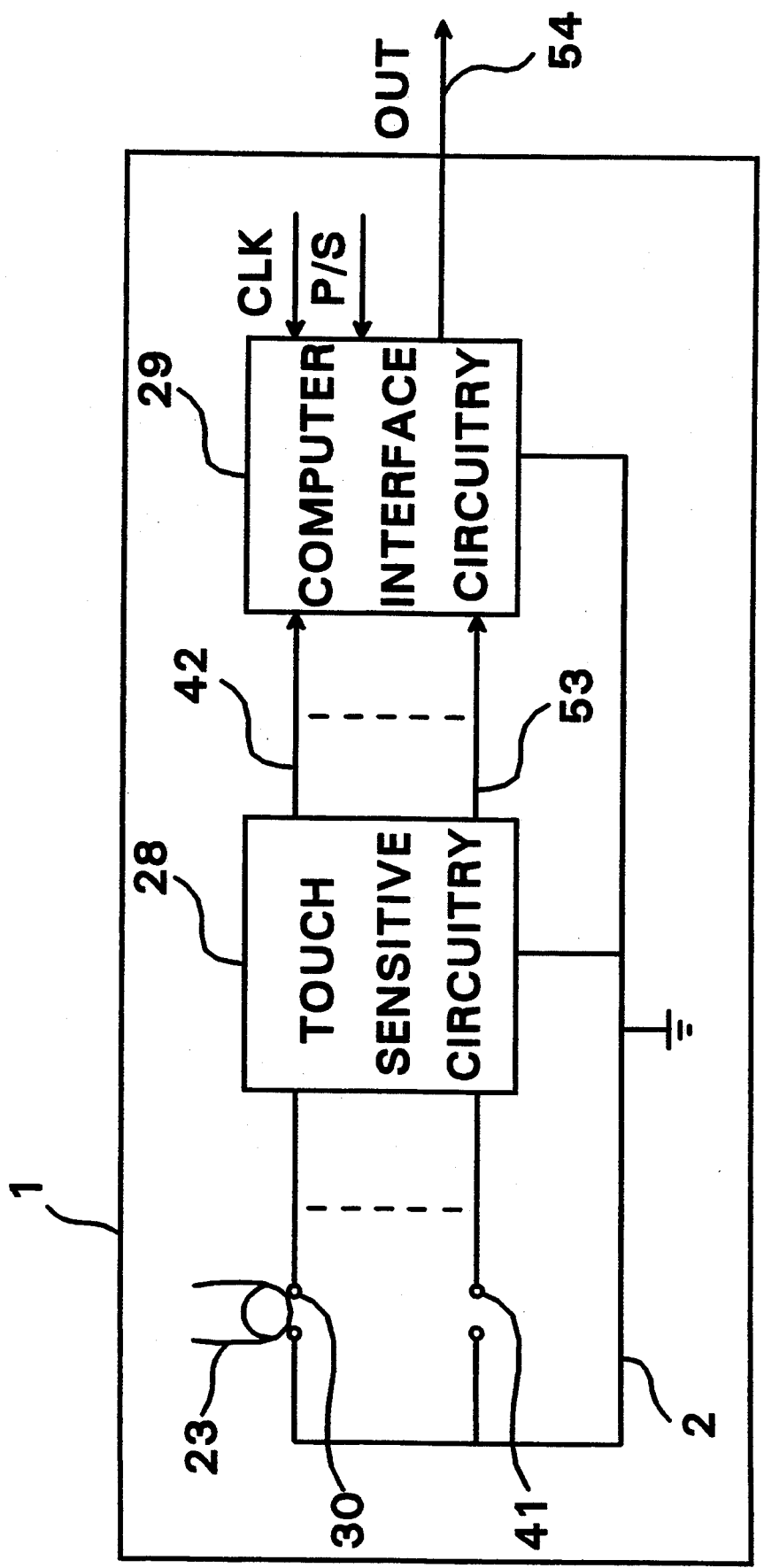
FIG. 6 is a block diagram of one embodiment of the invention illustrating the electronic circuitry needed to use the invention with the Super Nintendo Entertainment System.
Figure 7:
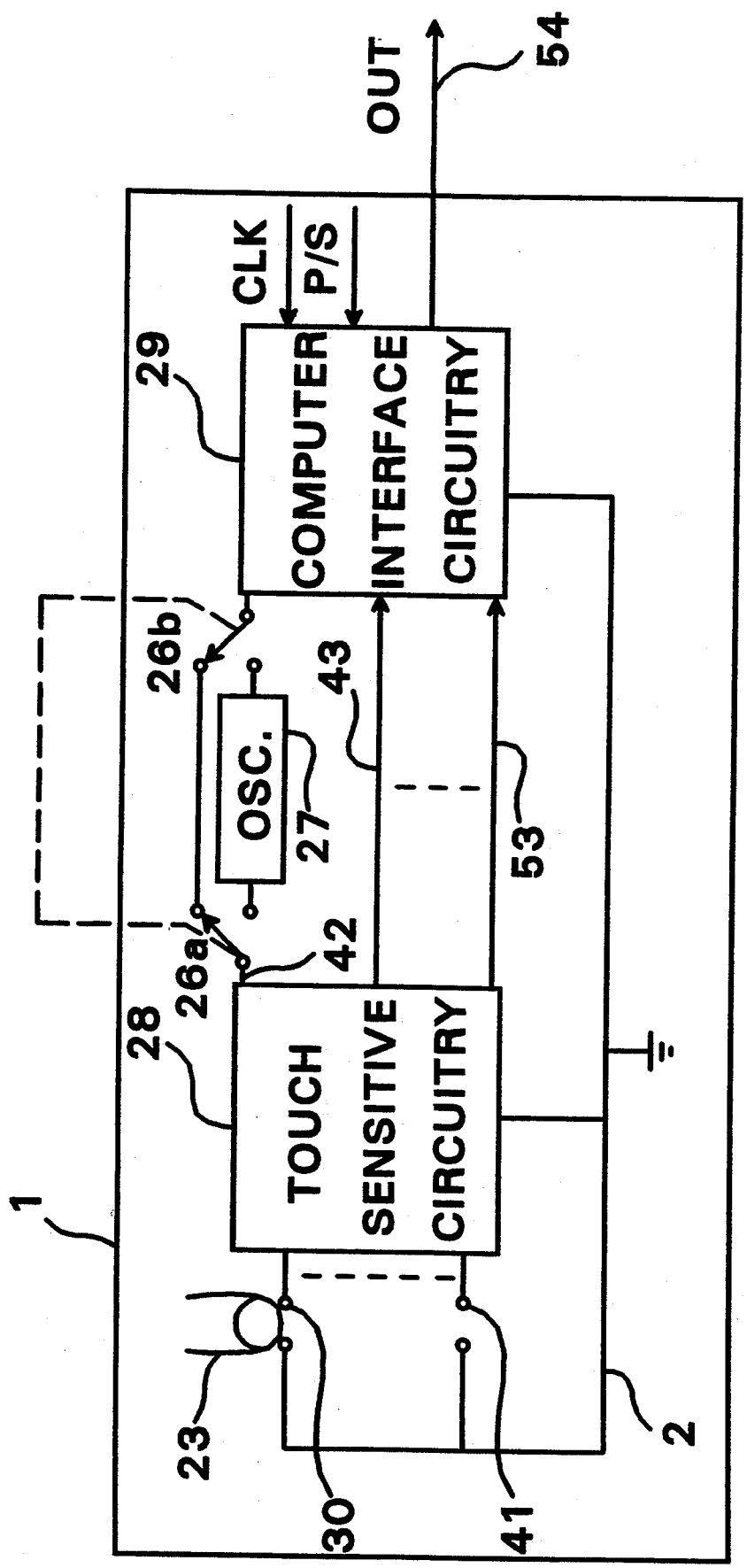
FIG. 7 is a block diagram of the added oscillator circuitry embodiment of the invention for use with the Super Nintendo Entertainment System.

Referring to FIGS. 6 and 7, the outside casing 1 is a durable non-conductive material that contains, insulates, and protects the inner circuits. The dimensions of the outside casing 1 are to be within reasonable size to accommodate all the needed contact points 30 through 41 and fit comfortably in the palms of both hands. The main contact point 2 must be in contact with the skin of the palms for any of the contact points 30 through 41 to complete the switching in the touch sensitive circuitry 28 in FIG. 6. When the skin and finger 23 in FIG. 6 bridges one or more of the contact points 30 through 41 to the main contact point 2 those touch sensitive switch circuits are engaged. The contact points 30 through 33 control the direction of a character on the video game screen. The character is any video displayed object on the game screen. Contact point 30 moves the character up on the screen, 31 moves the character to the left, 32 moves the character down, and contact point 33 moves the character to the right of the screen. Contact point 34 is a select switch which the player uses to select options on the video game screen and contact point 35 is the start button which initiates the video game from the beginning. Contact points 36 through 41 are action buttons which depend upon the certain video game cartridge installed in the computer system. The specific functions of the contact points 30 though 41 can vary depending on the video game or a level change in the game. The input contact points 30 to 41 are connected to the touch sensitive circuitry 28 which outputs the status of the inputs 30 to 41 on connections 42 to 53. The information about the status of the switches is transferred from touch sensitive circuitry 28 into the computer interface circuitry 29. The computer interface circuitry 29 converts the information to a form that the Super Nintendo Entertainment System can read, and outputs the information to the computer system through the output connection 54. The touch sensitive circuitry 12 and 28 are identical except that touch sensitive circuitry 28 has four addition touch activated switch circuits added to accommodate the input needs of the Super Nintendo Entertainment System.

FIG. 7 shows one embodiment of the invention with an oscillator 27 added between the touch sensitive circuitry 28 and the computer interface circuitry 29. The oscillator 27 is to provide a continuous digital pulse when a touch sensitive contact that the oscillator relates to is engaged. When the touch sensitive contact is disengaged the oscillator circuitry 27 is disabled. The switch 26 converts contact point 30, which relates with touch sensitive output 42 and oscillator 27, to either a normal operating touch sensitive switch or to a rapid turning "on" and "off" of the switch. This rapid oscillation switches the contact 30 point "on" and "off" faster than can be done with the finger 23. This is a great video game playing advantage; for example, jumping faster to avoid a barrage of obstacles from opposing video game characters. Separate oscillator circuitry can be added to each touch sensitive switch, with similar connections as shown in FIG. 7, if so desired. The oscillator circuitry 27 alternates the output from +5 volts to 0 volts at a constant rate determined by the frequency. The frequency is the rate of speed the output is changed from a high logic level to a low level. The computer interface circuitry 29 converts the status of the inputted oscillator signal and outputs on the connection 54 the information in a format the Super Nintendo Entertainment System recognizes.

Figure 8:
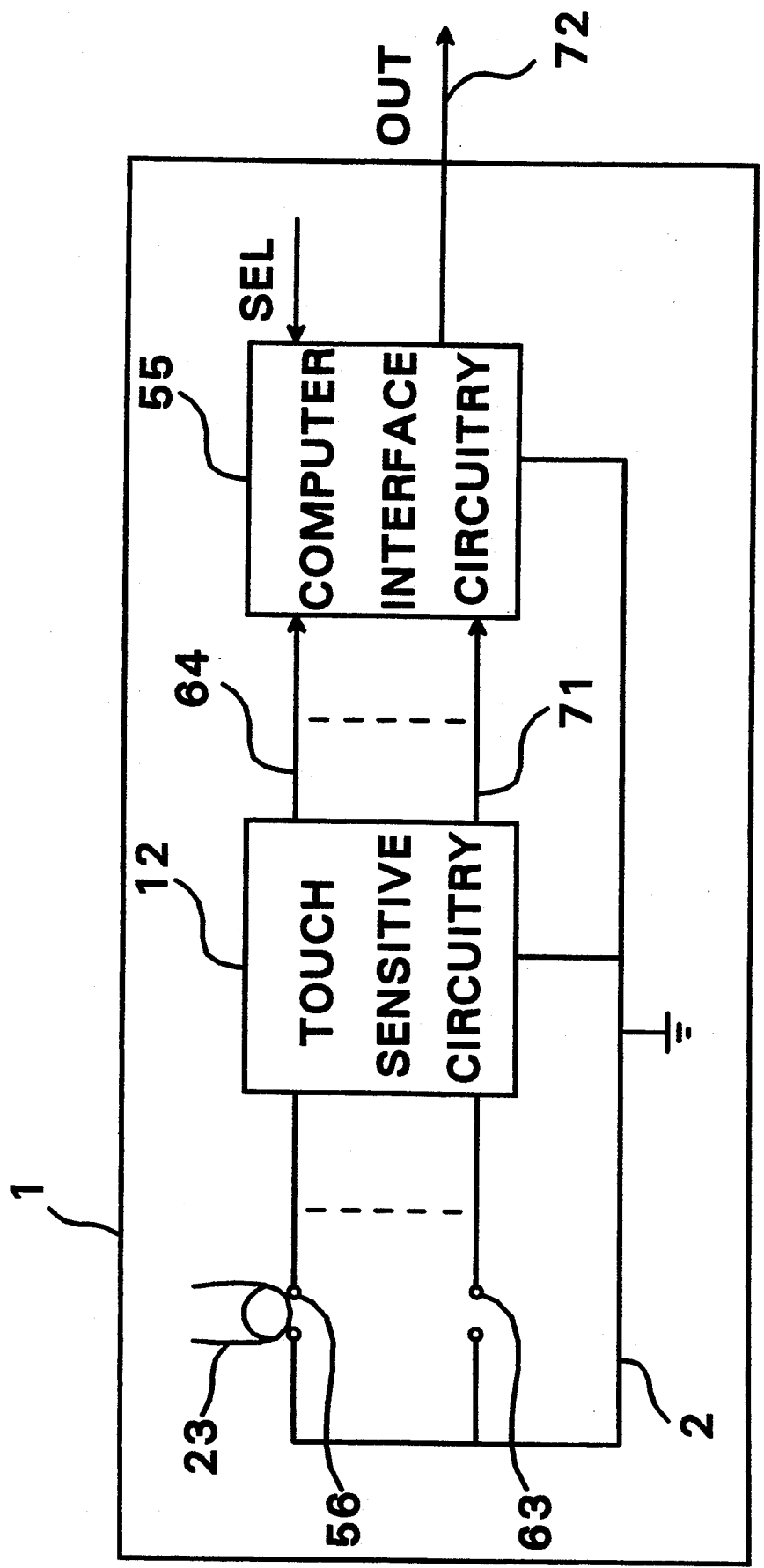
FIG. 8 is a block diagram of one embodiment of the invention illustrating the electronic circuitry needed to use the invention with the Sega Genesis Video Entertainment System.
Figure 9:
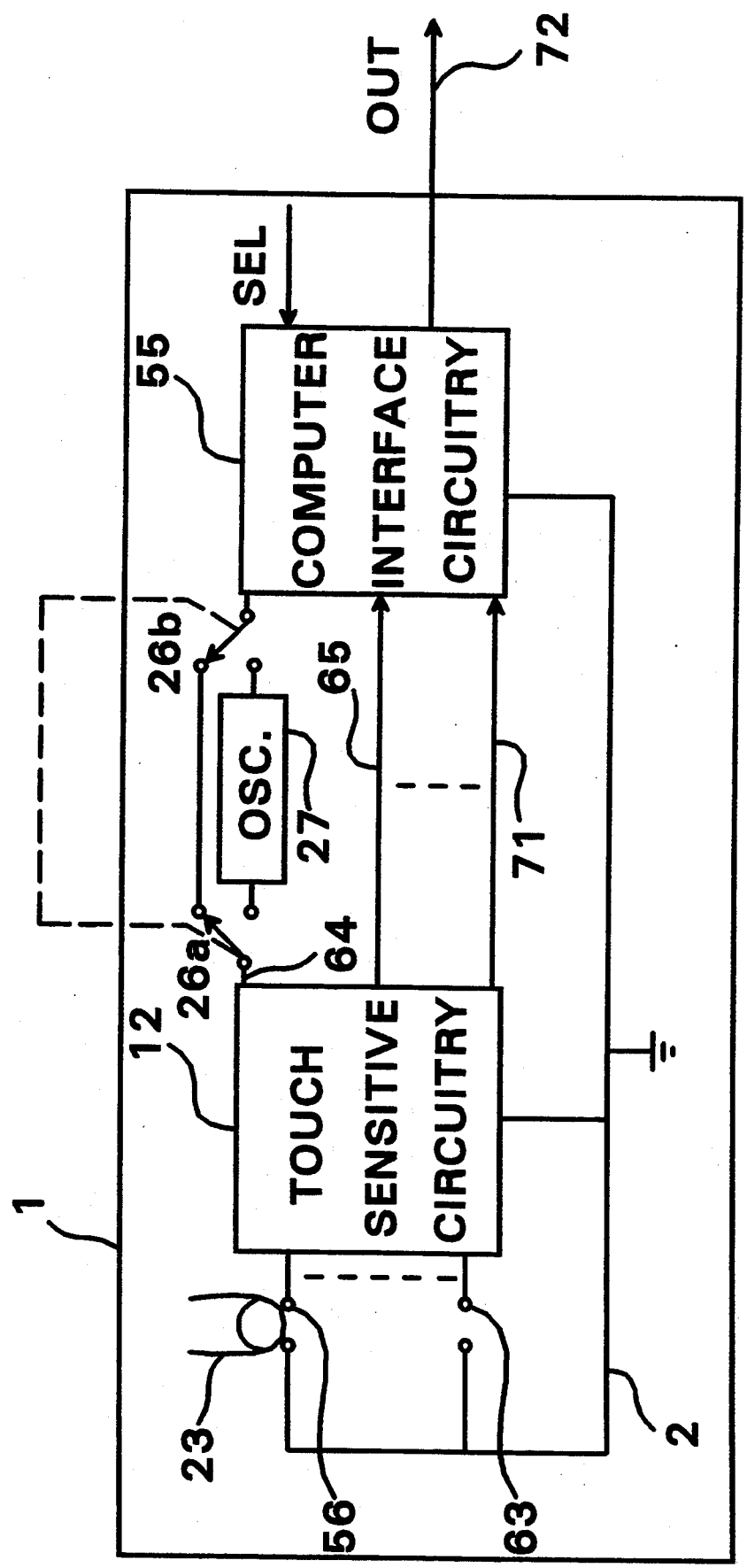
FIG. 9 is a block diagram of the added oscillator circuitry embodiment of the invention for use with the Sega Genesis Video Entertainment System.

Referring to FIGS. 8 and 9, the outside casing 1 is a durable non-conductive material that contains, insulates, and protects the inner circuits. The dimensions of the outside casing 1 are to be within reasonable size to accommodate all the needed contact points 56 through 63 and fit comfortably in the palms of both hands. The main contact point 2 must be in contact with the skin of the palm for any of the contact points 56 through 63 to complete the switching in the touch sensitive circuitry 12 in FIG. 8. When the skin and finger 23 in FIG. 8 bridges one or more of the contact points 56 through 63 to the main contact point 2 those touch sensitive switch circuits are engaged. The contact points 56 through 59 control the direction of a character on the video game screen. The character is any video displayed object on the game screen. Contact point 56 moves the character up on the screen, 57 moves the character to the left, 58 moves the character down, and contact point 59 moves the character to the right of the screen. Contact point 60 is the start button which initiates the video game from the beginning. Contact points 61 through 63 are action buttons which depend upon the certain video game cartridge installed in the computer system. The specific functions of the contact points 56 though 63 can vary depending on the video game or a level change in the game. The input contact points 56 to 63 are connected to the touch sensitive circuitry 12 which outputs the status of the inputs 56 to 63 on connections 64 to 71. The information about the status of the switches is transferred from touch sensitive circuitry 12 into the computer interface circuitry 55. The computer interface circuitry 55 converts the information to a form that the Sega Genesis Video Entertainment System can read, and outputs the information to the computer system through the output connection 72.

FIG. 9 shows one embodiment of the invention with an oscillator 27 added between the touch sensitive circuitry 12 and the computer interface circuitry 55. The oscillator 27 is to provide a continuous digital pulse when a touch sensitive contact that the oscillator relates to is engaged. When the touch sensitive contact is disengaged the oscillator circuitry 27 is disabled. The switch 26 converts contact point 56, which relates with touch sensitive output 64 and oscillator 27, to either a normal operating touch sensitive switch or to a rapid turning "on" and "off" of the switch. This rapid oscillation switches the contact 56 point "on" and "off" faster than can be done with the finger 23.

This is a great video game playing advantage; for example, punching an opposing video game character at a faster rate. Separate oscillator circuitry can be added to each touch sensitive switch, with similar connections as shown in FIG. 9, if so desired. The oscillator circuitry 27 alternates the output from +5 volts to 0 volts at a constant rate determined by the frequency. The frequency is the rate of speed the output is changed from a high logic level to a low level. The computer interface circuitry 55 converts the status of the inputted oscillator signal and outputs on the connection 72 the information in a format the Sega Genesis Video Entertainment System recognizes.

I claim:

1. A touch sensitive video game controller to be held between the hands of the user, said controller comprising:

an electrically non-conductive top housing and a singularly electrically conductive bottom housing which combine to form an outer housing for said controller, said housing containing touch sensitive circuitry and interface means;

said top housing having a plurality of singularly electrically conductive first contact points, each first contact point being mounted below said top housing, extending through an aperture in said top housing and projecting above said top housing, said bottom housing being connected to one end of a supply voltage and forming a second electrically conductive contact point, said second contact point and any one of said plurality of first contact points being bridged by the skin of the user by the holding of said controller and simultaneous touching of any one of said first contact points thereby activating touch sensitive circuitry;

said touch sensitive circuitry comprising a plurality of touch sensitive circuits, each said touch sensitive circuit comprising three resistors arranged in series, with each end of said series being respectively connected to a positive and a negative terminal of the said supply voltage, wherein one of said resistors includes the electrical skin resistance of a user, whereby the electrical resistance of the skin to the passage of electrical current forms a part of said touch sensitive circuit and the simultaneous touching of any of said first contact points and said second contact point completes said circuit and activates said interface means;

and said interface means including means for outputting a signal representative of said touch, said signal being in a form recognizable as a controller input for use with a video game computer system.

2. The video game controller of claim 1 in which said plurality of first electrical contact points comprises eight contact points, said touch sensitive circuitry comprises eight touch sensitive circuits, and said interface means outputs a signal in a form recognizable as a controller input for use with a Nintendo Entertainment System.

3. The video game controller of claim 1 in which said plurality of first electrical contact points comprises twelve contact points, said touch sensitive circuitry comprises twelve touch sensitive circuits, and said interface means outputs a signal in a form recognizable as a controller input for use with a Super Nintendo Entertainment System.

4. The video game controller of claim 1 in which said plurality of first electrical contact points comprises eight contact points, said touch sensitive circuitry comprises eight touch sensitive circuits, and said interface means outputs a signal in a form recognizable as a controller input for use with a Sega Genesis Entertainment System.

5. The video game controller of any one of claims 2, 3, or 4, further comprising oscillator means connected between one or more of said touch sensitive circuits an said interface means, said oscillator means for outputting a rapid repetitive digital signal to said interface means upon activation of said touch sensitive circuit, such that a user's single touch results in a plurality of rapid, repetitive output signals.

* * * * *